United States Patent [19]

Hansen

[11] Patent Number: 4,835,723

[45] Date of Patent: May 30, 1989

[54] PHASE COORDINATED MULTISTAGE DIGITAL FILTER

[75] Inventor: Victor L. Hansen, Beaverton, Oreg.

[73] Assignee: Tektronix, Inc., Beaverton, Oreg.

[21] Appl. No.: 34,463

[22] Filed: Apr. 3, 1987

[51] Int. Cl.⁴ .............................................. G06F 15/31
[52] U.S. Cl. ............................. 364/724.01; 364/724.1
[58] Field of Search .................... 364/724, 723, 724.01, 364/724.1, 724.13

[56] References Cited

U.S. PATENT DOCUMENTS

| | | | |
|---|---|---|---|
| 3,988,607 | 10/1976 | Eggermont et al. | 364/724 |
| 4,020,332 | 4/1977 | Crochiere et al. | 364/724 |
| 4,701,874 | 10/1987 | Akai et al. | 364/724.01 |

OTHER PUBLICATIONS

Crochiere et al., "Optimum FIR Digital Filter Implementations for Decimation, Interpolation, and Narrow-Band Filtering" *IEEE Trans. on Acoustics, Speech, and Signal Processing* vol. ASSP-23, No. 5 Oct. 1975 pp. 444-456 364/724.

Primary Examiner—David H. Malzahn
Attorney, Agent, or Firm—John P. Dellett; Peter J. Meza

[57] ABSTRACT

In a cascaded system of finite-duration impulse response filters, the transfer function of each filter relating its output data sequence to its input data sequence is selected such that elements of its output data sequence are in phase with the first element of its input data sequence. Operation of each filter other than the first cascaded filter is suppressed until it receives from the preceding filter, the first output data sequence element which is in phase with the first element of the input data sequence of the preceding stage, thereby ensuring that the first element of the output data sequence of the first filter is in phase with the first element of the input sequence to the first filter.

10 Claims, 3 Drawing Sheets

PHASE COORDINATED MULTISTAGE DIGITAL FILTER

BACKGROUND OF THE INVENTION

The present invention relates in general to digital filters of the type having multiple filter stages, and in particular to a multistage digital filter which produces a periodic output data sequence in response to a periodic input data sequence wherein the first data element of the output data sequence is in phase with the first data element of the input data sequence.

Digital filters produce output data sequences having data elements which are computed as functions of elements of the input data sequences. "Direct" digital filters, which produce one output data sequence element for each input data sequence element, are often used to provide low pass filtering without changing the number of elements in the sequence. "Decimation" digital filters reduce the number of elements in a data sequence and are sometimes utilized to compress data sequences representing waveforms so that the data sequences can be more efficiently stored or transmitted. "Interpolation" digital filters increase the number of elements in a data sequence and may be used to restore data points to a previously decimated data sequence. Decimation and interpolation filters may be cascaded to form a multistage low pass digital filter which requires fewer computations per second than a direct digital filter having similar low pass filtering characteristics. (See L. R. Rabiner, "A Novel Implementation for Narrow Band FIR Digital Filters", IEEE Transactions on Acoustics, Speech, and Signal Processing, Vol. ASSP-23, No. 5, October 1975.)

Under steady state conditions a digital filter may amplify or attenuate certain frequencies of oscillation in the magnitude of elements in its input data sequences, but the filter does not add new frequencies. Thus, for every cycle of oscillation in the output data sequence, there is a corresponding cycle of oscillation in the input data sequence. However, cycles in the output data sequence may be delayed from corresponding cycles in the input data sequence for an amount of time determined by the transfer function of the filter. In addition, elements of an output data sequence may be "phase shifted" in the sense that the elements of the input and output data sequences may not occur at the same relative times during corresponding cycles.

In many applications it is desirable that the first element of the output data sequence of a filter be in phase with the first element of its input data sequence so that input and output data sequences may be correlated in time. However in a multistage digital filter, various filter stages may produce output sequences that have phase shifted elements. Moreover, depending on the amount of the delay of a filter, the first element of its output data sequence may not be in phase with the first element of the input data sequence even though other input and output sequence elements are in phase.

SUMMARY OF THE INVENTION

The present invention relates to a multistage digital filter wherein each stage is a finite-duration impulse response (FIR) filter producing a periodic output data sequence in response to a periodic input data sequence, and wherein stages are cascaded such that the input data sequence supplied to each stage (other than the first stage) is provided by the output data sequence produced by the preceding stage.

In accordance with the present invention, the transfer function of each filter stage relating its output data sequence to its input data sequence is selected such that elements of its output data sequence are in phase with the first element of its input data sequence. In addition, operation of each stage (other than the first stage of the cascade) is suppressed until it receives a first input sequence element which is in phase with the first input data sequence element of the preceding stage. Operation of the first stage is suppressed until it receives the first element of its input data sequence. Thus the first element of the output data sequence of the last stage is in phase with the first element of the input sequence to the first stage of the filter.

It is accordingly an object of the invention to provide a multiple stage digital filter for producing a periodic output data sequence in response to a periodic input data sequence wherein the first element of the output data sequence is in phase with the first element of the input data sequence.

The subject matter of the present invention is particularly pointed out and distinctly claimed in the concluding portion of this specification. However, both the organization and method of operation of the invention, together with further advantages and objects thereof, may best be understood by reference to the following description taken in connection with accompanying drawings wherein like reference characters refer to like elements.

DRAWINGS

DETAILED DESCRIPTION

The present invention relates to a multistage digital filter wherein each stage is a finite-duration impulse response (FIR) filter producing a periodic output data sequence in response to a periodic input data sequence, and wherein stages are cascaded such that the output data sequence produced by each stage other than the last stage comprises the input data sequence to the next stage. FIR filters produce an output data sequence in which each element is a sum of a finite number of terms, each term comprising the product of a scaler coefficient and an element of the input data sequence. FIR filters may be grouped into three categories, "direct", "decimation" and "interpolation". A direct filter produces one output data sequence element for each input data sequence, a decimation filter produces fewer than one output data sequence element for each input data sequence element, and an interpolation filter produces more than one output data sequence element for each input data sequence element.

Under steady state conditions, an FIR filter may amplify or attenuate certain frequencies of oscillation in the magnitude of elements in its input data sequence but does not add new oscillation frequencies. Thus for a given cycle of an output data sequence there is a corresponding cycle of oscillation in the input data sequence. However, cycles in the output data sequence may be delayed from corresponding cycles in the input data sequence. The duration of the delay is determined by the number of input sequence elements between the first and last input sequence elements included in the computation of each output sequence element, and the period between each input sequence element. Since the period between elements is usually constant, the delay of the filter is usually expressed not in units of time but in terms of the number of input data sequence elements.

Elements of an output data sequence may be "out of phase" with elements of an input data sequence when none of the input and output sequence elements occur at the same relative times during corresponding cycles in the input and output data sequences.

Figure 1:
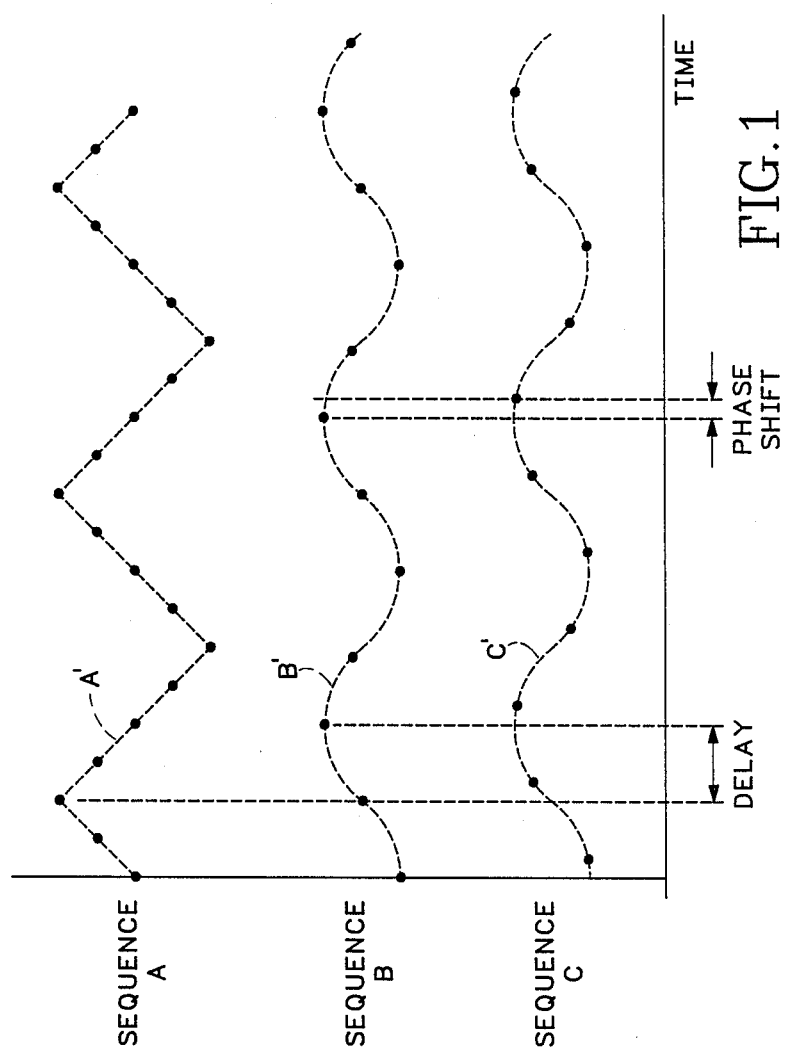
FIG. 1 is a timing diagram illustrating delay and phase shift in digital filters.

For example, with reference to FIG. 1, a timing diagram shows the magnitudes of three data sequences A, B and C as functions of time. Data sequence A may be produced by digitizing an analog sawtooth signal A'. Data sequences B and C are produced in response to sequence A by different low pass decimating FIR filters. Data sequences B and C oscillate at the same frequency as input data sequence A but correspond to analog waveforms B' and C' which are smoother than the sawtooth signal A'. Both filters "decimate" by a factor of 2 since output data sequences B and C comprise only half as many elements as input data sequence A. Cycles of both output data sequences B and C are delayed by two input data sequence A elements following corresponding cycles of input data sequence A. However, while elements of sequences A and B are in phase with one another, elements of sequence C are phase shifted with respect to elements of sequence A. Note, for example, that sequences A and B both include elements coinciding with the peaks of the analog waveforms A' and B', whereas peak magnitude elements of waveform C are shifted from the peak of waveform C' by the amount of the phase shift.

In many applications it is desirable that elements of the output data sequence of a filter be in phase with its input data sequence, and more particularly that the first element of the output data sequence be in phase with the first element of the input data sequence. However, in a multistage digital filter of the prior art, each filter stage may have a different delay and may phase shift its output data sequence elements by some amount, and the total delay and phase shift between the input data sequence of the first stage and the output sequence of the last stage may be difficult to determine and difficult to adjust.

In accordance with the present invention, to ensure that the output data sequence of a multistage FIR filter is in phase with its input data sequence, the transfer function of each direct, decimating and/or interpolating filter stage is chosen such that elements of its output data sequence are in phase with the first element of its input data sequence. In addition, the operation of each stage (other than the first stage of the multistage filter) is suppressed until it receives an input sequence element which is in phase with the first input data sequence element of the preceding stage. The operation of the first stage is suppressed until it receives the first element of its input data sequence. Thus the first element of the output data sequence of the last stage is in phase with the first element of the input sequence to the first stage of the filter.

The transfer function of a direct FIR filter may be expressed as follows:

$$w(i) = \sum_{n=0}^{N-1} h(n) * v(i-n) \qquad [1]$$

where $w(i)$ is the $i^{th}$ output data sequence element, $v(i)$ is the $i^{th}$ input data sequence element, $h(n)$ is a selected coefficient, and $N$ is the "length" of the filter. For a direct, FIR filter of length $N=3$, the first five output data sequence elements are as follows:

$w(0) = h(0)*v(0)$ $w(1) = h(0)*v(1) + h(1)*v(0)$ $w(2) = h(0)*v(2) + h(1)*v(1) + h(2)*v(0)$ $w(3) = h(0)*v(3) + h(1)*v(2) + h(2)*v(1)$ $w(4) = h(0)*v(4) + h(1)*v(3) + h(2)*v(2)$

TABLE I

Table I shows that the $i^{th}$ element $v(i)$ of the input sequence $v$ forms three products, $h(0)*v(i)$, $h(1)*v(i)$, and $h(2)*v(i)$, and that each successive product is included as a term in a sum associated with a separate, successive element $w(i-N+1)$ through $w(i)$ of the output data sequence $w$. For a "full-band" FIR filter, all coefficients $h(n)$ have non-zero values. For a "half-band" FIR filter of length $N=1, 5, 9, 13 \ldots$, $h(n)=0$ when n is odd. For a half-band FIR filter of length $N=3, 7, 11, 15 \ldots$, $h(n)=0$ when n is even. Note that the first $N-1$ output data sequence elements have fewer than N terms, because input data sequence elements $v(i)$ for $i<0$ do not exist. The first $N-1$ elements of the output data sequence comprise the "transient response" of the filter.

For a full-band FIR filter of any length N, and for half-band filters of length $N=1, 5, 9, 13 \ldots$, the delay is $(N-1)/2$. Thus a full-band direct FIR filter of length $N=3$ has a delay of 1. For half-band filters of length $N=3, 7, 11, \ldots$, the delay may be shortened to $[(N-1)/2]-1$ because $h(N-1)$ and $h(0)$ are both equal to 0 and therefore the first and last terms of the each output sequence element need not be computed. For a half-band direct filter of length $N=3$, coefficients $h(0)$ and $h(2)$ are 0. In such a half-band filter, $w(i)$ could be produced without waiting for $v(i+1)$. Therefore, in some implementations of a half-band filter of length $N=3$, the delay is shortened to 0.

In order for output data sequence elements to be in phase with input data sequence elements, the delay $d$ must be a whole number. Thus, since the delay is $(N-1)/2$ or $[(N-1)/2]-1$, N must be odd. If N is even, all output data sequence elements will be out of phase with all input data sequence elements. Therefore, in the multistage digital filter of the present invention, all direct FIR stages are of odd length.

A decimation FIR filter of length N also produces an output data sequence w in which each element is a sum of terms, each term comprising the product of a selected coefficient and previously occurring elements of the input data sequence x. However, only one output data sequence element $w(i)$ is produced for every M input data sequence elements, where "M" is the "decimation factor" of the filter. The transfer function of a decimation FIR filter may be expressed as follows:

$$w(i) \sum_{n=0}^{N-1} h(n) * v(C + iM - n) \quad [2]$$

Decimation filters also have delays of $(N-1)/2$, or in the case of certain half-band filters, $[(N-1)/2]-1$. Thus in order for the output data sequence produced by a decimation filter to have elements which are in phase with elements of its input data sequence, the length N of the filter must be odd. However, not all decimation filters having odd lengths produce an output data sequence element which is in phase with its first input data sequence element. From equation [2], it can be seen that the magnitude of each output data sequence element $w(i)$ depends in part on the choice of the value of C. For a filter of length $N=3$ with $M=2$ and $C=0$, having a transfer function according to equation [2], the first five terms $w(i)$ of the output data sequence $w$ are as shown in Table II below:

$w(0) = h(0)*v(0)$ $w(1) = h(0)*v(2) + h(1)*v(1) + h(2)*v(0)$ $w(2) = h(0)*v(4) + h(1)*v(3) + h(2)*v(2)$ $w(3) = h(0)*v(6) + h(1)*v(5) + h(2)*v(4)$ $w(4) = h(0)*v(8) + h(1)*v(7) + h(2)*v(6)$

TABLE II

In contrast, for a filter of length $N=3$, with $M=2$ and $C=1$, having a transfer function according to equation [2], the first five elements of the output data sequence $w$ are shown in Table III:

$w(0) = h(0)*v(1) + h(1)*v(0)$ $w(1) = h(0)*v(3) + h(1)*v(2) + h(2)*v(1)$ $w(2) = h(0)*v(5) + h(1)*v(4) + h(2)*v(3)$ $w(3) = h(0)*v(7) + h(1)*v(6) + h(2)*v(5)$ $w(4) = h(0)*v(9) + h(1)*v(8) + h(2)*v(7)$

TABLE III

By comparing Tables I, II, and III it can be seen that a "decimate by 2" filter (i.e. $M=2$) produces an output data sequence having half as many elements as a direct filter of the same length, and that element $w(Mi+C)$ of a direct FIR filter has the same value as element $w(i)$ of a decimation FIR filter of the same length. It may also be seen that the $C=0$ decimation filter of Table II eliminated ("decimated") every other output sequence element produced by the direct filter of Table I starting with element $w(1)$, and that the $C=1$ decimation filter of Table III decimated every other output data sequence element produced by the direct filter of Table I, starting with element $w(0)$.

The $N=3$ filters of Tables I, II and III all have a delay of $(N-1)/2 = 1$ when $h(2)$ is nonzero. As previously discussed, for the direct filter output sequence of Table I, output data sequence element $w(1)$ is in phase with the first input sequence element $v(0)$. Therefore, in order to ensure that a decimation filter of $N=3$ produces an output sequence element in phase with element (0), the value of C must be chosen such that an output data sequence element having the same value as element $w(1)$ of the direct filter of Table I is produced. By inspection of Tables I, II and III it is seen that element $w(0)$ of the sequence of Table III has the same value as output data sequence element $w(1)$ of Table I, and that no similarly valued element is found in Table II. Thus for a decimation filter of length $N=3$ and decimation factor $M=2$, one must choose $C=1$ in order to ensure that an output data sequence element is produced which is in phase with the first input sequence element $v(0)$.

Therefore, to ensure that a decimation filter of length N produces an output sequence element in phase with its first input sequence element, not only must N be odd, but the value of C must be properly chosen. From equation [2] it can be seen that the $j^{th}$ element $w(j)$ of the output sequence may be produced when the last element $v(C+jM)$ of the input sequence needed to complete the series is available. Therefore for a filter of delay d it is necessary to choose a value for C such that for some integer value of j, $$C + jM = d \quad [3]$$

and $$0 \leq C < M \quad [4]$$

For a filter of length $N=3$, decimation factor $M=2$ and delay $d=(N-1)/2$, in order to satisfy equations [3] and [4], C must be equal to 1 and j must be equal to 0. Thus for the such a decimation filter, the first output data sequence element $w(j) = w(0)$ is in phase with $v(0)$ when $C=1$.

For a decimation filter, for example of length $N=25$, decimation factor $M=5$, and delay $d=(N-1)/2$, equation [3] gives:

$C + jM = (N-1)/2$ $C + j5 = (25-1)/2 = 12$

Since, according to equation [4], C must be less than $M=5$, it can be shown that j must be 2 and C must be 2. Thus when C is chosen to be 2, the third output data sequence element $w(2)$ is in phase with the first input sequence element $v(0)$. If C has any other value, no output sequence element will be in phase with $v(0)$. By comparison, for a half-band decimation filter of length $N=25$, decimation factor $M=5$, and delay $d=[(N-1)/2]-1$, equation [3] results in:

$C + jm = [(N-1)/2] - 1$ $C + j5 = [(25-1)/2] - 1 = 11$

Since C must be less than $m=5$, j must be 2 and C must be 1 in order for an output data sequence element to be in phase with the first input data sequence element $v(0)$.

Thus it is seen that for a decimation filter, in order to ensure that an element of the output data sequence is in phase with the first element of the input data sequence, the value of N must be odd, and the values of C and j must be selected such that for a given combination of decimation factor M, and delay d, C satisfies relations [3] and [4] above. It should be noted that when j is selected in this fashion, $w(j)$ will be the first element of the output data sequence which is in phase with the first element of the input data sequence.

An interpolation filter produces L output data sequence elements for each input data sequence element where L, the "interpolation factor" of the filter, is a number greater than 1. The transfer function of an FIR interpolation filter having an interpolation factor L=2 may be expressed as follows:

$$w(2*i) = \sum_{n=0}^{Lim1} h(2*n) * v(i - n) \quad [5]$$

$$w(2*i + 1) = \sum_{n=0}^{Lim1} h(2*n + 1) * v(i - n) \quad [6]$$

where Lim1=(N−1)/2, Lim2=((N−1)/2)−1 when N is odd, and where Lim1=(N−2)/2 and Lim2=(N−2)/2 when N is even.

For an interpolation filter of length N=5, interpolation factor L=2, the first five elements w(i) of the output data sequence w in response to input data sequence v are as shown in Table IV below:

w(0)=h(0)*v(0)

w(1)=h(1)*v(0)

w(2)=h(0)*v(1)+h(2)*v(0)

w(3)=h(1)*v(1)+h(3)*v(0)

w(4)=h(0)*v(2)+h(2)*v(1)+h(4)*v(0)

w(5)=h(1)*v(2)+h(3)*v(1)

w(6)=h(0)*v(3)+h(2)*v(2)+h(4)*v(1)

w(7)=h(1)*v(4)+h(3)*v(2) s

TABLE IV

From Table IV it is seen that two output data sequence elements w(2*i) and w(2*i+1) are produced for each input data sequence element v(i). Full-band, and some half-band, interpolation FIR filters also have a delay of d=(N−1)/2, with d expressed in terms of the number of output sequence elements, while other half-band interpolation filters have a delay of d=[(N−1)/2]−1. In order for an interpolation filter to produce an output sequence element in phase with the first input data sequence element, filter length N must be odd. For an odd length interpolation FIR filter having an interpolation factor L=2 and delay d, the output data sequence element w(d) is in phase with input data sequence element v(0). Thus, for example, a full-band interpolation filter of length N=5 and interpolation factor L=2 has a delay of 2 and therefore output data sequence element w(2) is in phase with input data sequence element v(0).

Thus, according to the present invention, when a plurality of direct, decimation and/or interpolation filters are to be cascaded, in order to ensure that such a filter cascade produces output data sequence elements in phase with the first element of its input data sequence, odd length filters are utilized. Moreover, in the case of a decimating filter, the combination of delay d, decimation factor M, and sequence selection constant C is chosen such that equations [3] and [4] hereinabove are satisfied.

In addition, to ensure that the first element of the output data sequence produced by the multiple stage filter is in phase with the first element of its input data sequence, operation of each stage other than the first is suppressed until it receives as input the first output element w(j) produced by the preceding stage which is in phase with the first input element to the preceding stage. When the preceding stage is a direct FIR filter, j is equal to d, the delay of the preceding stage. When the preceding stage is an interpolation FIR filter, j=d where d is the delay of the filter. When the preceding stage is a decimation FIR filter, j is the value which satisfies equations [3] and [4] hereinabove.

Figure 2:
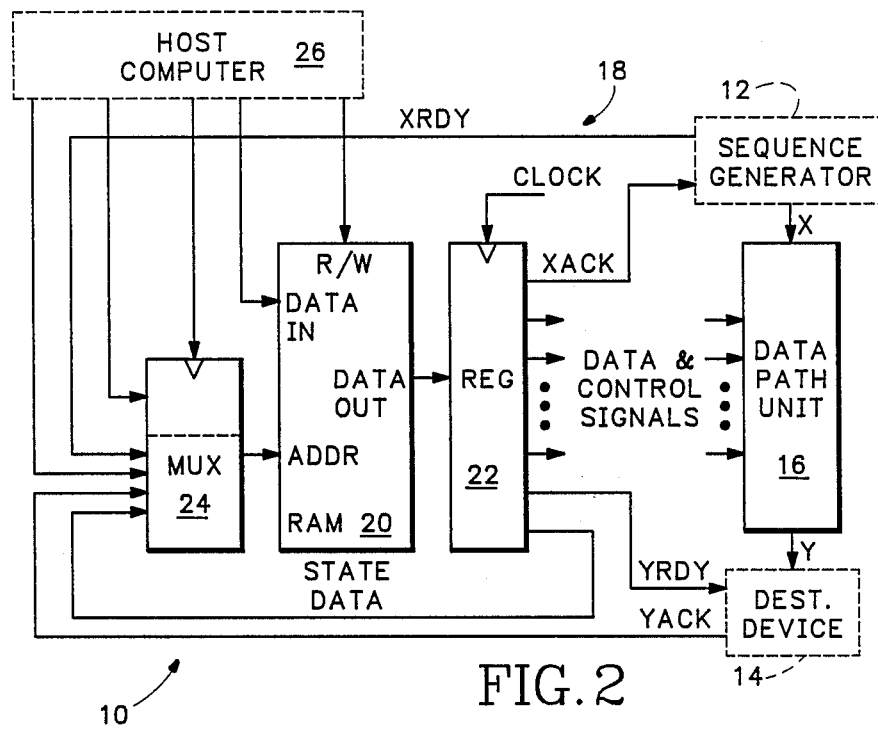
FIG. 2 is a block diagram of a multistage digital filter of a type suitable for implementing the present invention.

With reference to FIG. 2, there is depicted in block diagram form a programmable multistage digital filter 10 adapted to implement the present invention, wherein each stage may be selectively programmed to perform the function of either a direct, decimating or interpolating FIR filter of selectable length N, interpolation factor L, decimation factor M, and/or sequence selection constant C. In addition, the operation of each filter stage may be suppressed until it receives as input the first output element produced by the preceding stage which is in phase with the first input sequence element of the preceding stage.

Multistage filter circuit 10 converts an input data sequence X produced by a sequence generator 12 into an output data sequence Y and passes the output data sequence to a destination device 14. Filter circuit 10 comprises a data path unit 16 adapted to calculate each element of the output data sequence Y according to the values of elements of the input data sequence X. Filter circuit 10 also comprises a state machine 18 which controls the operation of data path unit 16 by transmitting sequences of data and control signals to data path unit 16 and which controls data transfer between data path unit 16, sequence generator 12 and destination device 14.

The basic function of state machine 18, generation of predetermined patterns of data and control signals in response to patterns of data input, may be implemented in a variety of wellknown ways. As shown in FIG. 2, state machine 18 suitably comprises a random access memory (RAM) 20 and a register 22 clocked by an externally generated clock signal. RAM 20 normally operates in a read mode, and addressed data stored in RAM 20 supplies input to register 22. The output of register 22 supplies data and control signals to data path unit 16, an acknowledge signal (XACK) to sequence generator 12, and a ready signal (YRDY) to destination device 14. Register 22 also stores and feeds back state data to addressing terminals of RAM 20 via a multiplexer 24. A data ready signal (XRDY) produced by sequence generator 12 and a data acknowledge signal produced by destination device 14 are connected to additional addressing inputs of RAM 20 via multiplexer 24.

In order to reprogram the operation of digital filter 10, data stored in RAM 20 may be altered by a host computer 26 which has access to data input terminals of RAM 20 and also to the address terminals of RAM 20 by way of multiplexer 24. Host computer 26 controls the switching state of multiplexer 24 and a read/write control terminal of RAM 20. Host computer 26 may reset state machine 10 to an initial state by means of a RESET signal supplied to the address terminals of RAM 20 via multiplexer 24, and may inhibit state changes in state machine 10 by means of a HALT signal, also supplied to address terminals of RAM 20 via multiplexer 24.

Figure 3:
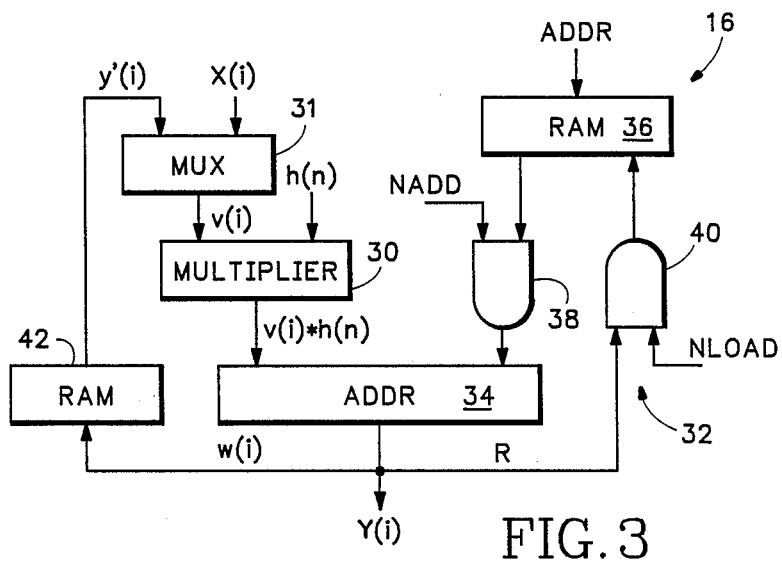
FIG. 3 is a simplified block diagram of the data path unit of the multistage digital filter of FIG. 2.

Referring to FIG. 3, depicting data path unit 16 of FIG. 2 in simplified block diagram form, data path unit 16 includes a multiplier 30 for multiplying input sequence terms v(i) by coefficients h(n) to produce product terms, and an accumulator 32 for accumulating (summing) product terms produced by the multiplier to produce output sequence elements w(i). Thus, for the direct FIR filter transfer function of equation [1] having, for example, a filter length N=3 (see Table I), in the process of computing the elements w(i) of output data sequence w, multiplier 30 multiplies each incoming sequence element v(i) by three coefficients h(0), h(1), and h(2) and adds each resulting product to a separate accumulated partial sum R(i), R(i+1) and R(i+2), each partial sum being associated with a separate output data sequence element w(i), w(i+1) and w(i+2). When all terms associated with a particular output sequence element w(i) for a particular stage have been accumulated, the resulting accumulated partial sum R(i) is provided a filter stage output element w(i).

For each filter stage, the next input data sequence element v(i) to be multiplied by multiplier 30 is selected by a multiplexer 31. If multiplier 30 is to generate a term for the first stage of a filter cascade, then multiplexer 31 selects X(i), the current element of the input data sequence for the cascade. If multiplier 30 is to generate a term for a filter stage other than the first stage of the cascade, then multiplexer 31 selects w'(i), the last output data sequence element produced by the preceding filter stage. The appropriate coefficient h(n) input to multiplier 30 is supplied by state machine 18 of FIG. 1.

Accumulator 32 includes an adder 34 and a random access memory (RAM) 36. Adder 34 is adapted to add each output term produced by multiplier 30 to an accumulated sum R stored in RAM 36. The sum produced by adder 34 may then be stored in RAM 36, thereby replacing the accumulated sum R with the result of the addition. Addressing of RAM 36 is controlled by an address signal ADDR produced by state machine 18 of FIG. 2. Data output terminals of RAM 36 are coupled to an input of adder 34 through a set of AND gates 38, each having another input controlled by a signal NADD produced by state machine 18 of FIG. 2. When NADD is low, a 0 value, rather than the currently addressed data in RAM 36, is passed to adder 34. The NADD signal may be driven low when the output of multiplier 30 is the first term of a sum to be accumulated in RAM 36 so that adder 34 merely adds a 0 to that term and forwards it for storage in RAM 36. The output of adder 34 is coupled to data input terminals of RAM 36 through another set of AND gates 40. A signal NLOAD produced by state machine 18 is applied to an additional input of each AND gate 40 and is driven low when RAM 36 is to store a 0 value rather than the output of adder 34. The NLOAD signal allows the contents of any storage location in RAM 36 to be initialized to 0 when necessary.

In implementing a direct full-band FIR filter stage having a transfer function according to equation [1], a total of N−1 storage locations for the stage are reserved in RAM 36 to allow for accumulation of N−1 terms. For example when N is 3, two storage locations in RAM 36 are provided to store partially accumulated sums R(i) and R(i+1) for the next two terms, w(i) and w(i+1), of the output data sequence. When v(i) is initially applied to one input of multiplier 30, the state machine 18 supplies coefficient h(0) to the other input of multiplier 30, and the multiplier produces the term h(0)*v(i). Adder 34 then sums this term with the partially accumulated sum R(i) for w(i) stored in RAM 36 and produces the result as the next element w(i) of the filter stage. The value of w(i) is not stored in RAM 36. Instead, the NLOAD signal applied to AND gate 40 is driven low, and the accumulated sum R(i) in the RAM 36 storage location holding associated with w(i) is initialized to 0 and subsequently utilized for accumulating the partial sum R(i+N−1) associated with output data sequence element w(i+N−1).

Next, state machine 18 supplies coefficient h(1) to multiplier 30 so that the multiplier produces the term h(1)*v(i). Adder 34 adds this term to the accumulated sum for element w(i+1) stored in RAM 36. The resulting partial sum R(i+1), which does not yet include all of the terms comprising element w(i+1), is then stored in RAM 36 to update the last accumulated value of R(i+1).

State machine 18 then supplies coefficient h(2) to the multiplier 30 which produces one more term h(2)*v(i), the first term of stage output data sequence element w(i+2). The NADD signal applied to AND gates 38 is driven low so that adder 34 sums this term with 0. The resulting output of adder 34 is then stored as partial sum R(i+2) at the RAM 36 address which previously contained the accumulated partial sum R(i) for the current stage output element w(i). At this point, multiplexer 31 may supply a new input data sequence element v(i+1) as input to multiplier 30, and the process of multiplying three coefficients h(0), h(1) and h(2) by the input data sequence element and accumulating three product terms is repeated.

Thus, each time an input data sequence element v(i) to a particular stage is selected by multiplexer 31, a total of N product terms are produced by multiplier 30, one of which terms is added to an accumulated partial sum R(i) to produce an output sequence element w(i) and the remaining N−1 terms are accumulated into partial sums R(i+1) through R(i+N−1) associated with output data sequence elements w(i+1) through w(i+N−1), the partial sums being stored in RAM 36.

When adder 34 adds the last term to an accumulated sum R(i) to produce the resulting output data sequence element w(i) of a particular stage, and when the stage happens to be the last stage of the cascaded filter, w(i) is transmitted out of data path unit 16 as the next element Y(i) of the cascade output sequence Y. However, when the current w(i) output of adder 34 is an element of an output data sequence w of a stage other than the last stage, w(i) is stored in another RAM 42. RAM 42 includes one storage location for holding the most recently generated output data sequence element w(i) for each intermediate stage, other than the last stage.

Inasmuch as the filter stages are cascaded, the output element w(i) of one stage becomes the input element of the next. Accordingly, the output element w(i) stored in RAM 42 for each intermediate stage may be provided as the next element w'(i) of the w' sequence input to multiplexer 31, and multiplexer 31 may select that element as the next element v(i) of the stage and supply it to multiplier 30. Thus the "feedback" path between the output of adder 34 and the input to multiplier 30 provided by RAM 42 and multiplexer 31 allows data path unit 16 to operate as cascaded filter stages by carrying out the functions of several filter stages on a "time sharing" basis. For example, multiplier 30 and accumulator 32 may process an input sequence element for a first stage by selecting an element v(i) of sequence v as the input to multiplier 30, and then process an input data sequence element for a second stage by selecting an element w'(i) of sequence w' as input to multiplier 30, and then process a next input data sequence element v(i+1) for the first stage by supplying that element to multiplier 30.

State machine 18 operates data path unit 16 such that the data processing unit gives priority to stage calculations in reverse order, the last stage having highest priority and the first stage having lowest priority. Therefore, when an input data sequence element for the last cascaded stage is available in RAM 42, that element is provided as the next input to multiplier 30. Conversely, a data processing unit input data sequence element X(i) is applied to the input of multiplier 30 only when RAM 42 is empty. Thus calculations for a latter stage always have priority over calculations for a preceding stage. Furthermore, in accordance with the present invention, application of input data to each stage may be suppressed until the preceding stage produces an output sequence element w(j) which is in phase with the first element of the input sequence of the preceding stage.

Figure 4:
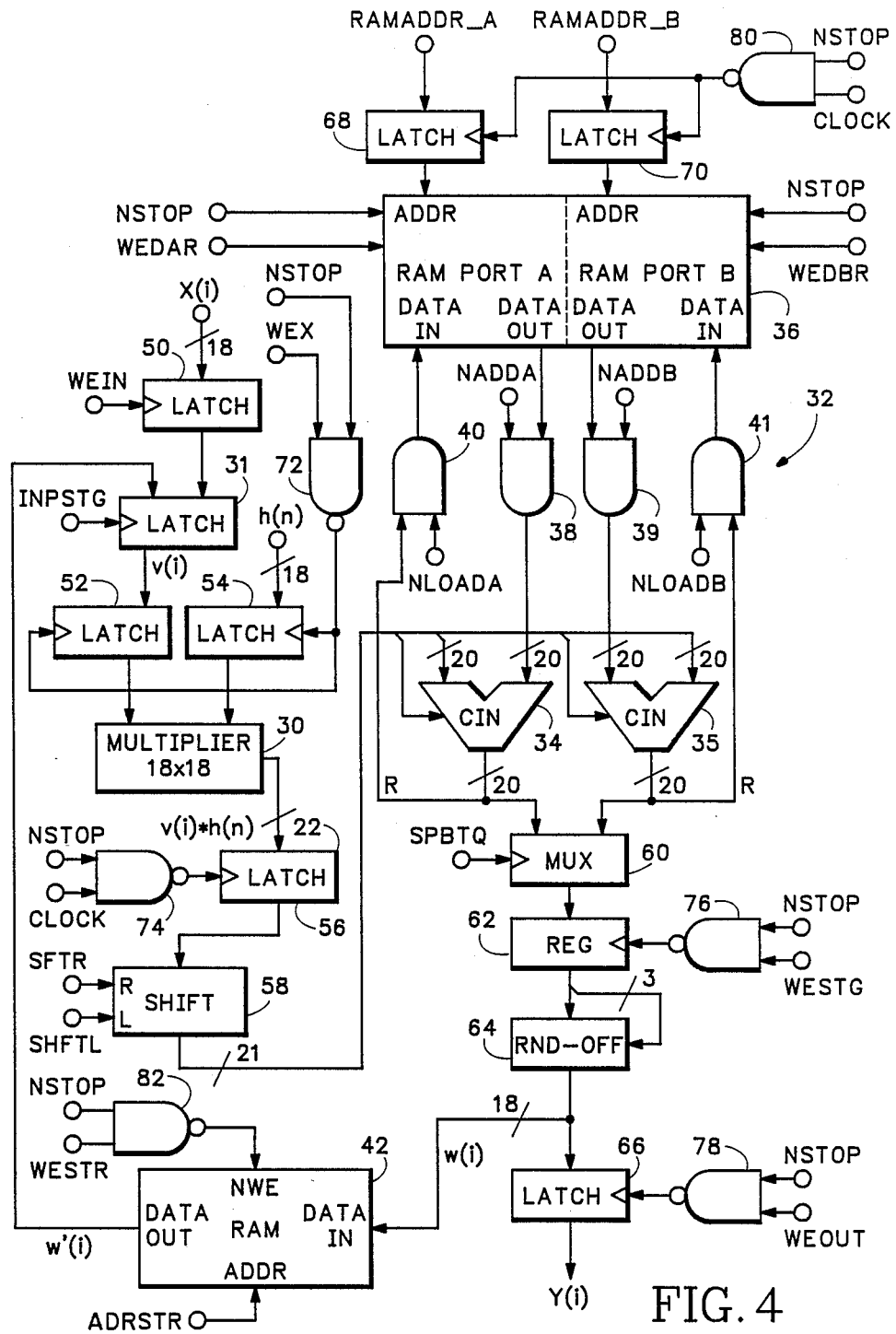
FIG. 4 is a detailed block diagram of the data path unit of the multistage digital filter of FIG. 2.

A more detailed block diagram of data path unit 16, shown in FIG. 4, illustrates additional features of data path unit 16. As discussed more fully hereinbelow, operating speed of data path unit 16 is improved by "pipelining" the data through multiplexer 31, multiplier 30, adder 34 and RAM 42, utilizing latches and registers to clock data through each device so that each device can operate concurrently. A shift register 58 is provided to selectively increment or decrement output terms produced by multiplier 30 by a factor of two, or to pass the term unchanged, thereby permitting selective scaling of such terms. The speed with which accumulator 32 carries out accumulation operations for linear phase FIR filter stages (as described in more detail below) is improved by providing RAM 36 as a dual port random access memory and by providing an additional adder 35 to assist adder 34 in performing accumulation operations. Provisions are also included for temporarily halting flow of data through the data path unit when necessary.

With reference to FIG. 4, 18-bit data path unit input data sequence elements X(i) are latched by a latch 50 onto the input of multiplexer 31, and the output of multiplexer 31 and 18-bit coefficients h(n) are latched onto inputs of multiplier 30 by latches 52 and 54, respectively. The 22-bit output of multiplier 30 is applied to the input of shift register 58 through a latch 56, and the 20 most significant bits of the 21-bit output of shift register 58 provide an input to adder 34 as well as to adder 35. A multiplexer 60 multiplexes the 20-bit outputs of adders 34 and 35 onto the input of a register 62, while the 18 most significant bits of the contents of register 62 are supplied as input to a round-off logic circuit 64. The 18-bit output of round-off logic circuit 64 is provided as input to a latch 66 and to data input terminals of RAM 42.

The output of ADDER 34 and a signal NLOADA are connected as inputs to a set of 20 AND gates 40, the outputs of AND gates 40 being connected to data input terminals of port A of dual port RAM 36. Data output terminals of port A of RAM 36, along with a signal NADDA, provide inputs to a set of 20 AND gates 38, the outputs of which drive an input of adder 34. Similarly, the output of ADDER 35 and a signal NLOADB are connected as inputs to a set of AND gates 41 while the outputs of AND gates 41 are connected to data input terminals of port B of dual port RAM 36. Data output terminals of port B along with a signal NADDB control inputs of a set of 20 AND gates 39, the outputs of which provide input to adder 35. When write enabled by the output of a NAND gate 80, driven by a system clock signal at its input, a pair of latches 68 and 70 latch addressing signals RAMADDRA and RAMADDRB produced by state machine 18 of FIG. 2 onto addressing terminals of ports A and B, respectively, of dual port RAM 36. Signals WEDAR and WEDBR produced by state machine 18 control whether ports A and B, respectively, are read or write enabled.

In carrying out filter stage operations according to the direct FIR filter transfer function of equation [2], when state machine 18 of FIG. 2 receives an XRDY signal from sequence generator 12, indicating that an 18-bit element X(i) of input sequence X is available at the input of latch 50, state machine 18 may transmit an enabling signal WEIN to latch 50, causing latch 50 to forward X(i) to multiplexer 31. When state machine 18 subsequently determines that X(i) is to be processed, it transmits a signal INPSTG to multiplexer 31, causing the multiplexer to forward X(i) to latch 52. At the same time, state machine 18 places an 18-bit coefficient h(0) on the input to latch 54. When state machine 18 determines that multiplier 30 has completed its last multiplication operation, the state machine transmits an enable signal WEX to a NAND gate 72 causing the NAND gate output to enable latches 52 and 54 thereby passing X(i) and h(0) to inputs of multiplier 30. Multiplier 30 computes h(0)*v(i) and passes it to latch 56. Latch 56, input enabled by a system clock signal acting through a NAND gate 74, passes the 22-bit output of multiplier 30 to shift register 58.

State machine 18 supplies a pair of control signal inputs SHFL and SHFR to shift register 58. When only SHFL is asserted, shift register multiplies its input by 2 and passes the 21 most significant bits of the result to adders 34 and 35. When only SHFR is asserted, shift register 58 divides its input by two. If neither SHFL nor SHFR are asserted, the shift register passes its input to adders 34 and 35 unchanged. Although shift register 58 produces a 21-bit output, only the most significant 20 bits are applied to inputs of adders 34 and 35. The remaining least significant bit is applied to a carry in (CIN) input of each adder to cause rounding of the multiplier output.

The additional adder 35 is provided to carry out accumulations concurrently with adder 34 for filter stages which are implemented with "symmetric" coefficients, such as linear phase FIR filter stages, in which for all h(n), h(n)=h(N−1−n). For example when N=7, h(0)=h(6), h(1)=h(5), and h(2)=h(4). When coefficients are symmetric, a term h(n)*v(i) produced by multiplier 30 has the same value as the term h(N−1−n)*v(i). Therefore adder 35, which has independent access to dual port RAM 36, may carry out an accumulation for the h(N−1−n)*v(i) term using the value of h(n)*v(i) at the same time that adder 34 carries out the accumulation for the h(n)*v(i) term. This substantially doubles the rate at which data path unit 16 can process an input data sequence element to a symmetric coefficient filter stage.

When adder 34 or 35 produces a fully accumulated sum R(i) associated with an output data sequence element w(i), state machine 18 transmits a signal SPBTQ to multiplexer 60 to couple the output of the adder 34 or 35 to the input of register 62. State machine 18 subsequently transmits an enabling signal WESTG to a NAND gate 76 and the output of NAND gate 76 enables register 62. The 18 most significant bits stored in register 62 are passed to input terminals of round-off circuit 64 while the least significant bit (LSB2), the next least significant bit (LSB1), and the most significant bit (MSB) of the data stored in register 62 are applied to control terminals of circuit 64. Circuit 64 increments its 18 bit input data according to the truth table shown in the following Table V:

TABLE V

| Increment | MSB | LSB1 | LSB2 |
|---|---|---|---|
| NO | 0 | 0 | 0 |
| NO | 0 | 0 | 1 |
| YES | 0 | 1 | 0 |
| YES | 0 | 1 | 1 |
| NO | 1 | 0 | 0 |
| NO | 1 | 0 | 1 |
| NO | 1 | 1 | 0 |
| YES | 1 | 1 | 1 |

When the 18-bit output of round-off circuit 64 is an element Y(i) of the output data sequence of the data path unit state machine 18 transmits an enable signal WEOUT to an input of a NAND gate 78. The output of NAND gate 78 causes latch 66 to latch Y(i) onto output terminals of the data path unit. With reference to FIG. 2, state machine 18 then transmits the YRDY signal to destination device 14, and when device 14 accepts Y(i), it acknowledges reception by asserting the YACK signal.

If the output w(i) of round-off circuit 64 is an element in the output data sequence of an intermediate filter stage other than the last stage of the cascade, state machine 18 addresses RAM 42 with the address of a storage location associated with such intermediate stage utilizing an address signal ADRSTR. State machine 18 transmits a WESTR signal to a NAND gate 82, the output of which write enables RAM 42 so that RAM 42 stores w(i). When state machine 18 subsequently determines that the stored w(i) value is to be next processed as an input signal to the next filter stage, according to the previously discussed order of priority, it transmits the appropriate address ADRSTR signal to RAM 42 so that the value of w(i) is stored therein.

NAND gates 72, 74, 76, 78, 80 and 82 each have a signal NSTOP produced by state machine 18 as an additional input and when NSTOP is driven low, latches 52, 54, 56, 66, 68, and 70, register 62, and RAM 42 cannot be write enabled. An NSTOP signal is also applied to enabling inputs of ports A and B of RAM 36, and when NSTOP is asserted, the RAM cannot be addressed or accessed. Thus when NSTOP is asserted, the data processing operation of data path unit 16 is halted. State machine 18 drives NSTOP low when the data processing pipeline within data processing unit 16 is full and destination device 14 is currently unable to accept another output data sequence element Y(i).

Referring to FIG. 4, when a filter stage is a decimating filter having a transfer function according to equation [2] hereinabove and having, for example, length N=3, decimation factor M=2 and sequence selection factor C−1 (see Table III), state machine 18 of FIG. 2 sets the INPSTG signal to apply v(0) to the input of latch 52, places h(1) on the input of latch 54, and then asserts the WEX signal, thereby latching h(1) and v(0) to the inputs of multiplier 30. The output of multiplier 30 is latched by latch 56 and passed through shift register 58 to adder 34. With NADDA driven low, adder 34 adds h(1)*v(0) to 0 and the result is stored as a partial sum R(0) in RAM 36.

When v(1) is next available at the input to multiplexer 31, state machine 18 of FIG. 2, sets the INPSTG signal to apply v(1) to the input of latch 52, places h(1) on the input of latch 54, and then asserts the WEX signal, thereby latching h(1) and v(1) to the inputs of multiplier 30. The output of multiplier 30 is passed through latch 56 and shift register 58 to adder 34. With NADDA driven high, adder 34 adds h(1)*v(1) to the accumulated sum R(1) to produce the result h(1)*v(1)+h(2)*v(0) which is provided as output sequence element w(0). State machine 18 applies h(2) to the input of latch 54 and asserts the WEX signal for latching h(2) and v(1) to the inputs of multiplier 30. The output of multiplier 30 is passed through latch 56 and shift register 58 to adder 34. With NADDA again driven low, adder 34 adds h(2)*v(1) to 0 and the result is stored as partial sum R(1) in RAM 36.

When v(2) is available at the input to multiplexer 31, state machine 18 of FIG. 2 sets the INPSTG signal to apply v(2) to the input of latch 52, places h(1) on the input of latch 54, and asserts the WEX signal to latch coefficient h(0) and sequence element v(2) to the inputs of multiplier 30. The output of multiplier 30 is transmitted through latch 56 and shift register 58 to adder 34. With NADDA driven high, adder 34 adds h(1)*v(2) to the accumulated sum R(1) to produce the result h(1)*v(2)+h(2)*v(1) which is stored in RAM 36 in place of the previously accumulated sum R(1).

Similar multiplication and accumulation procedures are performed for each subsequent element v(i) of the stage input sequence such that when i is an odd integer, it is multiplied by h(0) and by h(2) to produce terms which are accumulated to form two successive partial sums R(i) and R(i+1), and such that when i is an even integer, it is multiplied by h(1) to produce a term which is accumulated in only one partial sum R(i). From equation [2], from Table III, and from the foregoing discussion, it is seen that filter circuit 10 may also include stages which act as decimation filters each producing an output data sequence having fewer elements than its input data sequence and wherein the transfer function relating output and input data sequences are programmably determined.

Note that the transfer function, including length N, the decimation factor M, and the sequence selection factor C for each decimation filter stage, can be independently adjusted to satisfy equations [3] and [4] hereinabove by adjusting the number and value of terms h(n) supplied to multiplier 30 and by changing the way in which product terms are accumulated by accumulator 32. Thus filter 10 is capable of implementing decimation filter stages wherein the first element of a stage's output data sequence is in phase with the first element of its input data sequence.

When a filter stage is an interpolation filter having, for example, a transfer function according to equations [5] and [6] hereinabove with N=5, state machine 18 of FIG. 2 initially sets the INPSTG signal to apply v(0) to the input of latch 52, places h(0) on the input of latch 54, and asserts the WEX signal, thereby latching h(0) and v(0) to the inputs of multiplier 30. The output of multiplier 30 is passed by latch 56 and shift register 58 to adder 34. With NADDA driven low, adder 34 adds h(0)*v(0) to 0 and the result is produced as output data sequence element w(0). State machine 18 applies h(1) to the input of latch 54 and asserts the WEX signal so as to latch h(1) and v(0) to the inputs of multiplier 30. The output of multiplier 30 is passed to adder 34, and with NADDA again driven low, adder 34 adds h(1)*v(0) to 0. The result is passed by multiplexer 60 to register 62 to provide output data sequence element w(1).

State machine 18 then applies h(2) to the input of latch 54 and asserts the WEX signal to latch h(2) and v(0) to the inputs of multiplier 30. The output of multiplier 30 is passed to adder 34. With NADDA still low, adder 34 adds h(2)*v(0) to 0 and the resulting partial sum R(2) is stored in RAM 36. State machine 18 next applies h(3) to the input of latch 54 and asserts the WEX signal to latch h(3) and v(0) to the inputs of multiplier 30. With NADDA still low, adder 34 subsequently adds the product h(3)*v(0) to 0 and the resulting partial sum R(3) is stored in RAM 36. Finally, state machine 18 applies h(4) to the input of latch 54 and asserts the WEX signal to latch h(4) and v(0) to the inputs of multiplier 30. With NADDA still low, adder 34 subsequently adds product h(4)*v(0) to 0 produce partial sum R(4) which is all stored in RAM 36.

Thereafter, when input data sequence element v(1) is available at an input to multiplexer 31, state machine 18 sets the INPSTG signal to apply v(1) to the input of latch 52. The state machine causes data multiplier 30 to sequentially produce terms h(0)*v(1), h(1)*v(1), h(2)*v(1), h(3)*v(1), h(4)*v(1), and causes accumulator 32 to accumulate these terms into sums R(2) through R(6) respectively, and in the process thereof, causes the accumulator to produce output data sequence elements w(2) and w(3). Subsequent input data sequence elements v(i) are processed in a similar fashion such that two output data sequence elements w(2*i) and w(2*i+1) are generated for each input data sequence element.

Note that the transfer function, including the length N and the interpolation factor L for each interpolation filter stage, can be independently adjusted by adjusting the number and values of terms h(n) supplied to multiplier 30 for each element of x(i) and the way in which product terms are accumulated by accumulator 32. Thus filter 10 can implement interpolation filter stages of odd length N so that output data sequences have elements in phase with input sequence elements.

Thus there has been described a digital filter circuit adapted to implement a cascade of direct, decimation and/or interpolation FIR filters of programmably determined length N, decimation factor M, interpolation factor M, and/or sequence selection constant C. To implement the phase coordinated multistage filter of the present invention, the transfer function of each filter stage relating its output data sequence to its data sequence may be adjusted such that elements of its output data sequence are in phase with the first element of its input data sequence. In addition, operation of the first stage is suppressed until it receives the first element of the multistage filter input data sequence and operation of each subsequent stage is suppressed until it receives an input sequence element which is in phase with the first element of the input data sequence of the preceding stage. Such adjustment of the transfer function of each stage and suppression of stage operation ensures that the first element of the output data sequence of the last stage is in phase with the first element of the input sequence of the first stage of the filter.

While a preferred embodiment of the present invention has been shown and described, it will be apparent to those skilled in the art that many changes and modifications may be made without departing from the invention in its broader aspects. The appended claims are therefore intended to cover all such changes and modifications as fall within the true spirit and scope of the invention.

I claim:

1. A digital filter comprising a plurality of digital filter stages arranged in cascaded relation, each filter stage including means for producing an output sequence of data elements, the magnitude of each data element of the output sequence being a function of the magnitude of at least one data element of an input sequence of data elements, and each filter stage including further means for suppressing the production of the output sequence of each filter stage until the first data element of the output sequence of each stage is in phase with the first data element of its input sequence.

2. The digital filter according to claim 1 wherein each of said filter stages comprises a finite-duration impulse response filter.

3. The digital filter according to claim 1 wherein at least one of said filter stages comprises a finite-duration impulse response decimation filter.

4. The digital filter according to claim 3 wherein at least one of said filter stages comprises a finite-duration impulse response interpolation filter.

5. A digital filter comprising:
at least one decimation filter including means for producing an output sequence of data elements in response to an input sequence of data elements, the magnitude of each data element of its output sequence being a function of the magnitude of a finite number of data elements of its input sequence, and each decimation filter including further means for suppressing the production of the output sequence of each decimation filter until the first data element of its output sequence is in phase with the first data element of its input sequence; and
at least one interpolation filter including means for producing an output sequence of data elements in response to an input sequence of data elements, the magnitude of each data element of its output sequence being a function of the magnitude of a finite number of data elements of its input sequence, each interpolation filter including further means for suppressing the production of the output sequence of each interpolation filter until the first data element of its output sequence is in phase with the first data element of its input sequence, and
means for providing the output sequence produced by each of said decimation and interpolation filters, except a last one thereof, as an input sequence to a next succeeding one of said filters in cascade relation.

6. The digital filter according to claim 5 wherein each of said decimation and interpolation filters is a finite-duration impulse response filter.

7. A digital filter comprising:
data processing means including means for producing a plurality of output sequences of data elements, each said output sequence being produced in response to a corresponding input sequence of data elements, the data processing means including further means for suppressing the production of the output sequence of the data processing means until the first data element of each output sequence is in phase with the first data element of its input sequence, and data routing means for selectively applying output sequences produced by said data processing means as input sequences to said data processing means.

8. The digital filter according to claim 7 wherein said data processing means computes each data element of each output sequence as a function of a finite number of data elements of the input sequence corresponding to the output sequence.

9. In a system comprising cascaded digital filters wherein each filter produces a periodic output sequence of data elements in response to a periodic input sequence of data elements according to an adjustable transfer function, and wherein production of selected output sequence of data elements of each filter according to its adjustable transfer function may be suppressed, a method for ensuring that the first output sequence data element produced by a last cascaded filter is in phase with the first data element of the input sequence to a first cascaded filter, said method comprising the steps of:

adjusting the transfer function of each of said filters such that at least one data element of the output sequence of each said filter is in phase with the first data element of its input sequence; and suppressing production of such data elements of each filter as would otherwise be produced according to its adjustable transfer function prior to production of an output sequence element which is in phase with the first element of the input sequence to said filter.

10. In a system comprising cascaded digital filters wherein each filter produces a periodic output sequence of data elements in response to a periodic input sequence of data elements according to an adjustable transfer function, and wherein the input sequence to each cascaded filter except a first filter is provided by selected elements of the output sequence of the next preceding filter, a method for ensuring that the first output sequence data element produced by a last cascaded filter is in phase with the first data element of the input sequence to said first cascaded filter, the method comprising the steps of:

adjusting the transfer function of each of said filters such that at least one data element of the output sequence of each filter is in phase with the first data element of its input sequence; and selecting as input sequence data elements for each said filter, other than for said first filter of said cascade, only the first data element of the output sequence of the next preceding cascaded filter which is in phase with the first data element of the input sequence to said next preceding filter and all subsequently produced output sequence data elements of said next preceding filter.

* * * * *